US008073161B2

(12) United States Patent
Hung et al.

(10) Patent No.: US 8,073,161 B2
(45) Date of Patent: Dec. 6, 2011

(54) AUDIO APPARATUS

(75) Inventors: Chun-Lung Hung, Taipei Hsien (TW); De-An Zhang, Shenzhen (CN); Wen-Ming Chen, Shenzhen (CN); Kun Huang, Shenzhen (CN); Jie Liu, Shenzhen (CN); Shao-Lin Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 766 days.

(21) Appl. No.: 12/180,552

(22) Filed: Jul. 27, 2008

(65) Prior Publication Data

US 2009/0167433 A1 Jul. 2, 2009

(30) Foreign Application Priority Data

Dec. 27, 2007 (CN) .......................... 2007 1 0203452

(51) Int. Cl.
*H03F 99/00* (2009.01)

(52) U.S. Cl. ......................................... 381/120; 381/97

(58) Field of Classification Search .................. 381/120, 381/97

See application file for complete search history.

(56) References Cited

U.S. PATENT DOCUMENTS

| | | | | |
|---|---|---|---|---|
| 4,368,435 | A | 1/1983 | Bloy | |
| 4,400,583 | A | 8/1983 | Bloy | |
| 5,339,363 | A * | 8/1994 | Fosgate | 381/97 |
| 6,232,833 | B1 | 5/2001 | Pullen | |
| 6,272,328 | B1 | 8/2001 | Nguyen et al. | |
| 6,680,645 | B2 | 1/2004 | Greitschus et al. | |
| 7,102,557 | B1 | 9/2006 | Frith | |

* cited by examiner

*Primary Examiner* — Steven J Fulk
(74) *Attorney, Agent, or Firm* — Altis Law Group, Inc.

(57) ABSTRACT

An audio apparatus includes an input, a first resistor, a first capacitor, an amplifier, a second resistor, a second capacitor, and an output. The input is used for inputting audio signals. The first resistor and the amplifier are serially connected to the input; wherein the first resistor is connected to the inverting input of the amplifier and the non-inverting input of the amplifier is connected to ground. The first capacitor has one end connected to a node between the first resistor and the inverting input of the amplifier, the other end connected to ground. The second resistor has one end connected to a node between the first resistor and the inverting input of the amplifier, the other end connected to the output of the amplifier. The second capacitor is connected between the inverting input and the output of the amplifier. The output is connected to the output of the amplifier, for outputting the audio signals after processing.

20 Claims, 1 Drawing Sheet

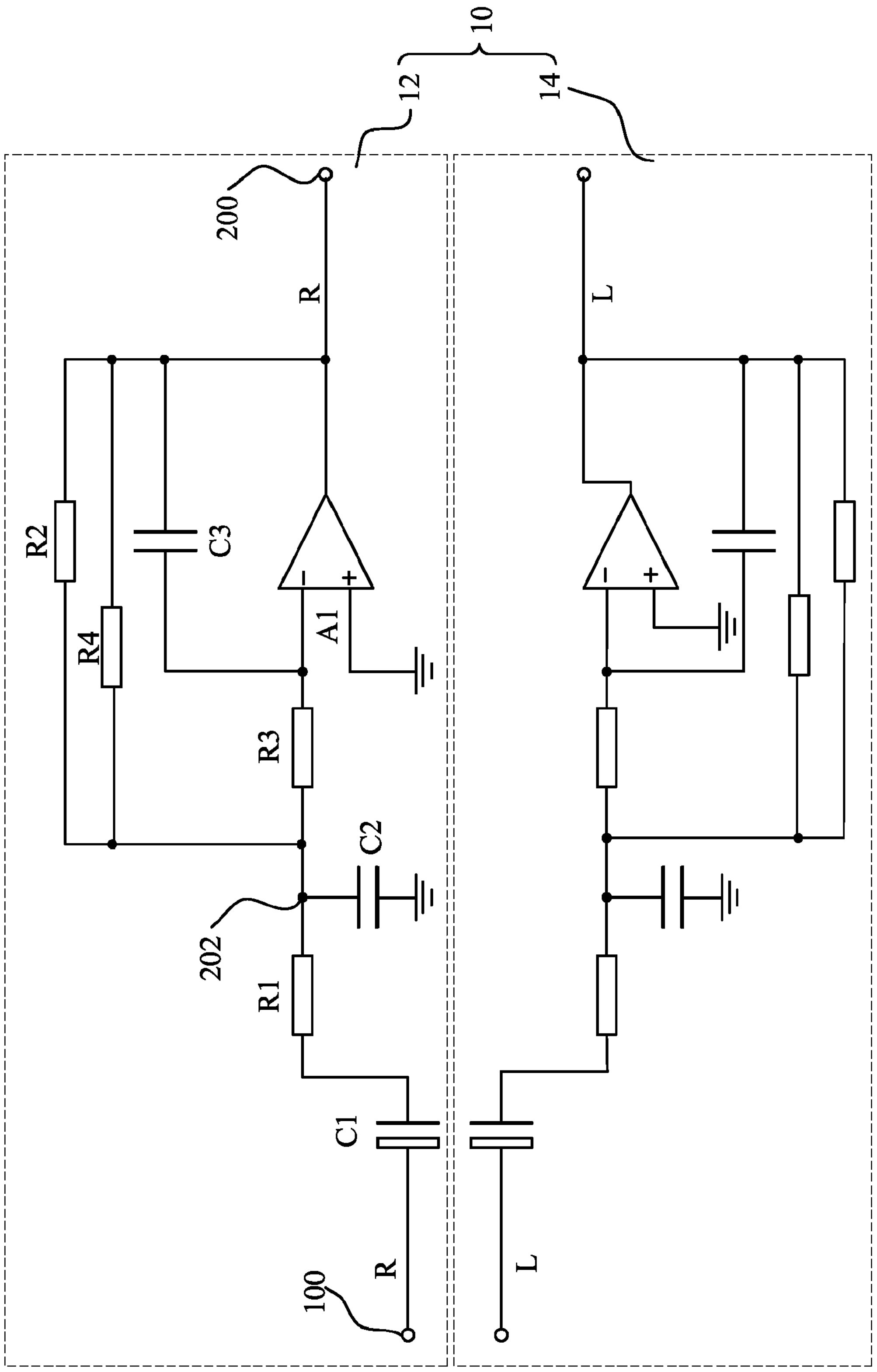
10
12
14
200
202
100
R
L
R1
R2
R3
R4
C1
C2
C3
A1

AUDIO APPARATUS

BACKGROUND

1. Field of the Invention

The present invention generally relates to audio apparatuses. Particularly, the present invention relates to an audio apparatus using an audio processing circuit.

2. Description of Related Art

Audio apparatuses are used for decoding audio files, and generating audio signals for driving speakers. When decoding the audio files, the audio apparatuses generate a lot of noise signals. Therefore, when the audio signals are fed to the speakers to reproduce the sounds, the noise signals are also produced, causing static sounds and affecting the audio effect.

Commonly, audio apparatuses incorporate filter capacitors in output circuitries, for filtering out the noise signals from the audio signals. However, the filter capacitors can filter out only some of the noise. In some occasions, the filter may even cause parts of audio signals to be lost. Furthermore, by incorporating the filter capacitors, the signal to noise rate (SNR) of the filtered signal can at most be about 85 dB.

Therefore, an audio apparatus capable of providing high audio effects is needed to provide audio signals with high SNR.

SUMMARY

An audio apparatus includes an input, a first resistor, a first capacitor, an amplifier, a second resistor, a second capacitor, and an output. The input is used for inputting audio signals. The first resistor and the amplifier are serially connected to the input; wherein the first resistor is connected to the inverting input of the amplifier and the non-inverting input of the amplifier is connected to ground. The first capacitor has one end connected to a node between the first resistor and the inverting input of the amplifier, the other end connected to ground. The second resistor has one end connected to a node between the first resistor and the inverting input of the amplifier, the other end connected to the output of the amplifier. The second capacitor is connected between the inverting input and the output of the amplifier. The output is connected to the output of the amplifier, for outputting the audio signals after processing.

Other advantages and novel features of the present invention will become more apparent from the following detailed description of preferred embodiment when taken in conjunction with the accompanying drawings.

BRIEF DESCRIPTION OF THE DRAWING

The drawing is a circuit diagram of an audio apparatus in accordance with an exemplary embodiment.

DETAILED DESCRIPTION OF THE EMBODIMENTS

Reference will now be made to the drawings to describe a preferred embodiment of the present audio apparatus.

Referring to the drawing, an audio apparatus in accordance with an exemplary embodiment is illustrated. The audio apparatus 10 includes two audio processing circuits 12, 14 that are able to process signals for different sound channels. The two audio processing circuits 12, 14 are generally identical. Only one audio processing circuit 12 is described hereinafter for simplicity.

The audio processing circuit 12 includes an input unit 100, a first capacitors C1, a second C2, a third C3, a first resistors R1, a second R2, a third R3, a fourth R4, an amplifier A1, and an output unit 200. The input 100, the first capacitor C1, the first resistor R1, the third resistor R3, and the inverting input of the amplifier A1 are connected in series.

In this embodiment, the first capacitor C1 is an electrolytic capacitor, and the anode and the cathode of the first capacitor C1 are connected to the input 100 and the first resistor R1, respectively. Preferably, the capacitance of the first capacitor C1 is 10 uF, with a ±5% tolerance, the resistance of the first resistor R1 is 7.5 kOhm, and the resistance of the third resistor R3 is 3.3kOhm, both having ±5% tolerances. The non-inverting input of the amplifier A1 is grounded, and the output of the amplifier A1 is connected to the output 200.

The second resistor C2 is connected between ground and a node 202 between the first resistor R1 and the third resistor R3. The capacitance of the second resistor C2 is 1500 pF, with a ±5% tolerance. The second resistor R2 and the fourth resistor R4 are connected in parallel with each other between the output 200 and the node 202. The second resistor R2 has a resistance of 15 kOhm, and the fourth resistor R4 has a resistance of 1 MOhm, both having ±5% tolerances. The third capacitor C3 is connected between the output and the inverting input of the amplifier A1. The capacitance of the third capacitor C3 is 150 pF, with a ±5% tolerance.

The signals received through the input 100 are filtered by the first capacitor C1, and then amplified by a difference amplifier circuit composed of the second resistor R1, the third resistor R3, the second capacitor C2, the amplifier A1, and the third capacitor C3. The (signal to noise rate) SNR can reach 100 dB, by choosing the above described capacitors and resistors. Also, the cut-off frequency of the difference amplifier circuit can be selected by using different second and third capacitors C2 and C3, depending on the frequency distribution characters of the input signal.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio apparatus comprising:

an input for inputting audio signals;

an amplifier having an inverting input and a non-inverting input;

a first resistor, wherein one end of the first resistor is connected to the input, the other end of the first resistor is connected to the inverting input of the amplifier, and ground is connected to the non-inverting input of the amplifier;

a first capacitor having one end connected to a node between the first resistor and the inverting input of the amplifier, the other end of the first capacitor connected to ground;

a second resistor having one end connected to a node between the first resistor and the inverting input of the amplifier, the other end of the second resistor connected to the output of the amplifier;

a second capacitor connected between the inverting input and the output of the amplifier; and an output connected to the output of the amplifier, for outputting the audio signals after processing.

2. The audio apparatus according to claim 1, further comprising a third resistor connected between the first resistor and the inverting input of the amplifier.

3. The audio apparatus according to claim 2, wherein one end of the second resistor is connected to a node between the first resistor and the third resistor.

4. The audio apparatus according to claim 2, wherein one end of the first capacitor is connected to a node between the first resistor and the third resistor.

5. The audio apparatus according to claim 2, wherein the third resistor has a resistance of 3.3 kOhm.

6. The audio apparatus according to claim 5, wherein the resistance of the third resistor has a ±5% tolerance.

7. The audio apparatus according to claim 1, further comprising a fourth resistor connected in parallel with the second resistor.

8. The audio apparatus according to claim 7, wherein the fourth resistor has a resistance of 15 kOhm.

9. The audio apparatus according to claim 8, wherein the resistance of the fourth resistor has a ±5% tolerance.

10. The audio apparatus according to claim 7, wherein the fourth resistor has a resistance of 1 MOhm.

11. The audio apparatus according to claim 10, wherein the resistance of the fourth resistor has a ±5% tolerance.

12. The audio apparatus according to claim 1, wherein the first resistor has a resistance of 7.5 kOhm.

13. The audio apparatus according to claim 12, wherein the resistance of the first resistor has a ±5% tolerance.

14. The audio apparatus according to claim 1, further comprising a third capacitor connected between the input and the first resistor.

15. The audio apparatus according to claim 14, wherein the capacitance of the third capacitor is 10 uF.

16. The audio apparatus according to claim 15, wherein the capacitance of the third capacitor has a ±5% tolerance.

17. The audio apparatus according to claim 1, wherein the first capacitor has a capacitance of 1500 pF.

18. The audio apparatus according to claim 17, wherein the capacitance of the first capacitor has a ±5% tolerance.

19. The audio apparatus according to claim 1, wherein the second capacitor has a capacitance of 150 pF.

20. The audio apparatus according to claim 19, wherein the capacitance of the second capacitor has a ±5% tolerance.

* * * * *